United States Patent [19]
Cerofolini et al.

[11] Patent Number: 5,707,899
[45] Date of Patent: Jan. 13, 1998

[54] SOI STRUCTURE WITH A DEEP THIN OXIDE LAYER PREPARED BY ION IMPLANTATION AT HIGH ENERGY FOLLOWED BY THERMAL TREATMENT

[75] Inventors: Gianfranco Cerofolini; Laura Meda, both of Milan, Italy

[73] Assignee: Istituto Guido Donegani S.p.A., Novara, Italy

[21] Appl. No.: 302,091

[22] Filed: Sep. 7, 1994

Related U.S. Application Data

[63] Continuation of Ser. No. 57,469, May 6, 1993, abandoned.

[30] Foreign Application Priority Data

May 15, 1992 [IT] Italy ................. MI92A1171

[51] Int. Cl.$^6$ ............................................. H01L 21/76
[52] U.S. Cl. ................. 438/407; 437/26; 437/62
[58] Field of Search ................. 437/24, 62, 26

[56] References Cited

U.S. PATENT DOCUMENTS

| | | | |
|---|---|---|---|
| 4,676,841 | 6/1987 | Celler | 148/1.5 |
| 4,749,660 | 6/1988 | Short et al. | 437/24 |
| 4,885,257 | 12/1989 | Matsushita | 437/11 |
| 4,975,126 | 12/1990 | Marguil et al. | 148/33.2 |
| 5,080,730 | 1/1992 | Wittkower | 148/33 |
| 5,143,858 | 9/1992 | Tomozane et al. | 437/24 |
| 5,238,858 | 8/1993 | Matsushita | 437/27 |

FOREIGN PATENT DOCUMENTS 2 616 590  6/1987  France .

OTHER PUBLICATIONS

Patent Abstracts of Japan, vol. 11, No. 355 (E–558), 19 Nov. 1987 & JP–A–62 132344 (NEC Corp.), 15 Jun. 1987, (Abstract).

Materials Science And Engineering B, vol. B2, No. 1–3, Feb. 1989, Lausanne CH, pp. 111–122, XP000032990, H. Baumgart, et al.: "Current Status of the Technology of Silicon Separated by Implantation of Oxygen".

Meda L, et al: "Kinetics of Oxygen Precipitation In Low Fluence Simox", Proceedings of the Fifth International Symposium on Silicon–on–Insulator Technology and Devices, St. Louis, MO, USA, 17–22 May 1992, 1992, Pennington, NJ, USA, Electrochem. Soc, USA, pp. 237–250 XP002012088.

Kilner J A et al. "Experimental and Theoretical Studies of the Build–Up of an Oxide Layer During Oxygen Ion Bombardment of Silicon", Ion Beam Synthesis of Compound and Elemental Layers. Symposium D of the 1991 E–MRS Spring Meeting, Strasbourg, France, 28–31 May 1991, ISSN 0921–5107, Materials Science & Engineering B (Solid–State Materials For Advanced Technology), 20 Jan. 1992, Switzerland, pp. 83–89 XP002012089.

Namavar F et al, "Characterization of Low Energy Simox (LES) Structures", 1990 IEEE SOS/SOI Technology Conference. (CAT. No.90CH2891–0), Key West, FL. USA, 2–4 Oct. 1990, ISBN 0–87942–573–3, 1990, New York, NY, USA, IEEE, USA, pp. 49–50 XP002012090.

*Primary Examiner*—George Fourson
*Attorney, Agent, or Firm*—Oblon, Spivak, McClelland, Maier & Neustadt, P.C.

[57] ABSTRACT

A process for preparing an SOI structure with a deep thin oxide layer which comprises, in succession, a first ion implantation at an oxygen fluence within the range of $10^{15}$–$10^{16}$ ions/cm$^2$, thermal treatment at a temperature within the range of 600°–900° C., a second ion implantation at an oxygen fluence within the range of $2\times10^{17}$–$8\times10^{17}$ ions/cm$^2$, and a final thermal treatment at a temperature within the range of 1150°–1400° C.

1 Claim, 3 Drawing Sheets

SOI STRUCTURE WITH A DEEP THIN OXIDE LAYER PREPARED BY ION IMPLANTATION AT HIGH ENERGY FOLLOWED BY THERMAL TREATMENT

This application is a continuation of application Ser. No. 08/057,469, filed on May 6, 1993, now abandoned.

BACKGROUND OF THE INVENTION

Multiple structures formed from crystalline semiconductor materials with buried dielectric layers, such as silicon on $SiO_2$ (SOI), can be applied in microelectronics to integrated circuits of MIS (metal-insulator semiconductor), C-MOS (complementary-metal oxide semiconductor) and bipolar type.

Of the various techniques which can be used to form buried dielectric layers, ion implantation has proved the most versatile and reliable.

Ion implantation is a technically valid but costly method for the synthesis of dielectric layers buried in crystalline semiconductors.

In the case of SOI, positive oxygen ions are implanted into a target consisting of single-crystal silicon. The ions, accelerated by an externally applied potential, penetrate into the crystal where they are distributed in depth in accordance with a certain profile, describable at first order by a Gaussian curve. The average depth at which the ions come to rest in the crystal increases with the acceleration potential. The total oxygen dose introduced is proportional to the implantation current integrated with respect to time.

The cost of the material produced in this manner, which is mainly due to the implantation time, can be reduced if the implantation current is increased.

This current increases with increased ion acceleration potential, consequently the higher the implantation energy the higher the current obtainable.

An oxygen implantation machine exists (NV-200 Eaton) which was developed to deliver the highest current obtainable with industrial equipment (85 mA) at 200 kV acceleration potential. There is also an SOI product, prepared by implanting oxygen with the NV-200 at a dose not less than $10^{18}$ $O/cm^2$ followed by high-temperature thermal treatment (within the range of 1150°–1405° C.), characterised by a thick buried layer of silicon dioxide which is continuous and homogeneous. The thicknesses resulting from these operating conditions are about 200 nm for the single-crystal silicon remaining on the surface and about 400 nm for the buried dielectric.

Implanting oxygen at high doses has the following drawbacks:
the material is costly because of the time required for introducing an adequate dose of oxygen;
the crystalline silicon quality is impaired because of the extended defectiveness produced by the excess elastic energy which the crystal has to absorb.

The defectiveness can be reduced by dividing the entire process into a number of partial implantation/thermal treatment cycles to achieve the same total dose. Reference should be made to a U.S.A. patent in the name of researchers of LETI, Grenoble (U.S. Pat. No. 4,975,126, Dec. 4, 1990, J. Margail et al.).

In this case the increase in material quality is achieved at the expense of product cost, which necessarily increases.

The consolidated SOI product concerned is well suitable as a dielectrically insulated substrate for specific applications requiring thick dielectrics (for example power devices), but does not have great versatility of application as it is restricted to high dielectric thickness which makes rearward dissipation of heat intrinsically more difficult during the operation of the microelectronic devices constructed on it.

The literature describes the possibility of obtaining thin (about 50–100 nm), continuous layers of silicon dioxide buried in single-crystal silicon, prepared by implanting low doses of oxygen (in the range of $2-7\times10^{17}$ $O/cm^2$) to reduce implantation energy (within the range of 20–50 keV) (F. Namavar et al., 1990 IEEE SOS/SOI Tech. Conf. Proc. Key West Fla., page 49).

In these cases high implantation current is not used, and the single-crystal semiconductor surface layers obtained are too thin (about 15–80 nm). These thicknesses are in fact insufficient for constructing integrated devices, and additional epitaxial crystalline growth is required to make them usable as substrates in microelectronics. This results in an increase in material cost. In addition, the epitaxial growth process is characterised by intrinsic defectiveness which is reflected in the grown layer.

SUMMARY OF THE INVENTION

The present applicant has now found that it is possible to prepare an SOI structure characterised by a deeply buried thin dielectric layer by high-energy implantation without requiring subsequent epitaxial growth.

The present invention therefore provides a process for preparing a deeply buried continuous homogeneous thin dielectric layer, itself forming an integral part of the invention, the process comprising substantially two stages of ion implantation at different ion acceleration energies (within the range of 50–200 keV), followed by thermal treatment.

In this manner a structure is obtained characterised by a deep continuous homogeneous thin dielectric layer in which a single-crystal semiconductor layer is preserved at the surface of thickness (greater than 100 nm) sufficient for constructing microelectronic devices.

Compared with known systems, this has the advantage of being able to operate at low oxygen fluence with a saving in implantation time, and in addition it is not necessary to grow an epitaxial single-crystal layer to surface-thicken the semiconductor.

The invention therefore relates to a process for preparing an SOI structure characterised by a buried silicon dioxide layer and a surface layer of single-crystal silicon, the silicon dioxide layer being thin and deep, the process comprising two ion implantations followed by two thermal treatments.

DESCRIPTION OF THE PREFERRED EMBODIMENTS

Figure 1:
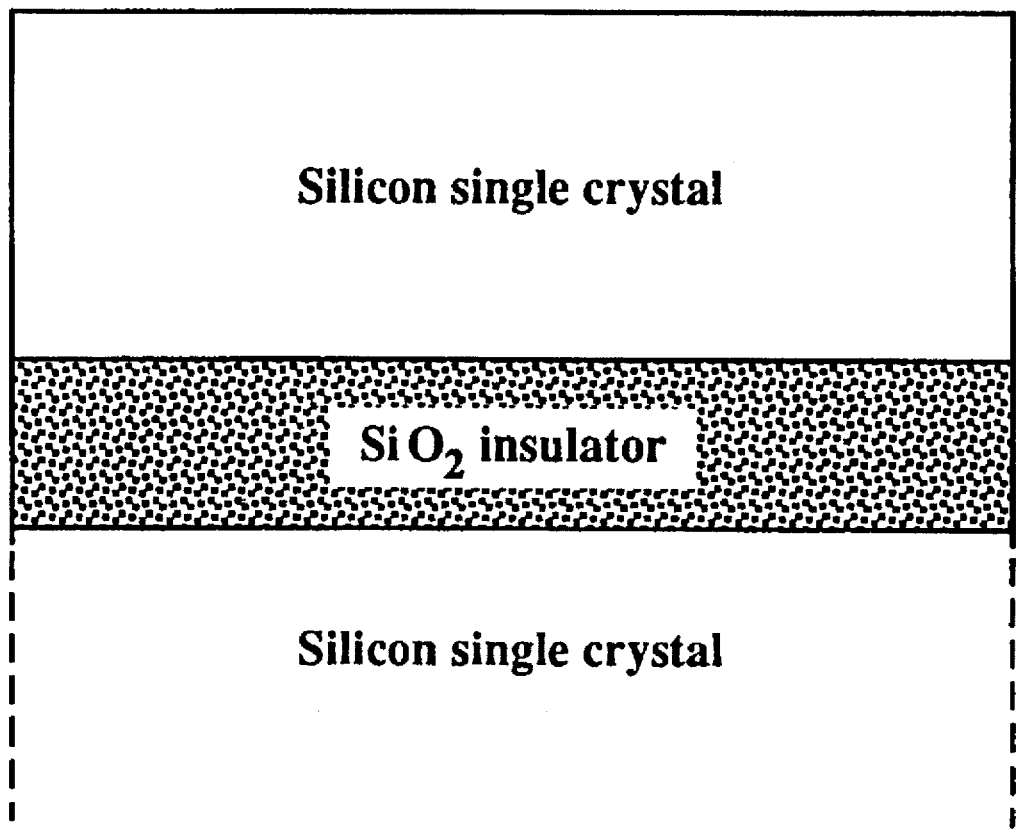
FIG. 1 is a pictorial representation of an SOI structure with a deep thin oxide layer according to an embodiment of the invention.

In the first stage the implantation is conducted at low fluence (typically within the range of $10^{15}-10^{16}$ $ions/cm^2$)

and at the temperature which the target assumes under only the influence of the incident beam.

The target consists of single-crystal silicon which is struck by an ion beam consisting of positive oxygen ions accelerated to an energy greater than 100 keV.

This process generates precipitation nuclei at a depth determined by the high oxygen concentration in the presence of rare recoil events with high transferred energy.

This layer of nuclei produced during ion implantation is made more stable by suitable thermal treatment (within the range of 600°–900° C.) which causes the larger nuclei to grow in volume and the smaller nuclei to dissolve.

Evidence of this mechanism is given in the work "Kinetics of Oxygen Precipitation in Low Fluence SIMOX" by L. Meda, S. Bertoni, G. F. Cerofolini, C. Spaggiari and R. Canteri, presented at the 5th International Symposium on SOI Technology and Devices, St. Louis, May 1997.

In the second stage the implantation is conducted at relatively high fluence (typically within the range of $2-8 \times 10^{17}$ ions/cm$^2$), but decidedly less than that used in the processes of the literature (G. K. Celler in: Semiconductor Silicon 1990, ed. by H. R. Huff, K. G. Barraclough and J. Chikawa, The Electrochemical Society, Pennington N.J., p. 472), at a target temperature maintained high (within the range of 500°–700° C.) during the entire implantation.

This process confers high mobility on the ions injected into the target and enables them to segregate on the precipitation nuclei created during the previous stage. For this, the energy in the second stage must be adjusted to the extent of moving the maximum oxygen concentration into the region in which the precipitation nuclei are present.

On increasing the implantation fluence the precipitates firstly gradually increase, then they coalesce to form a continuous even if non-uniform layer.

Subsequent high-temperature thermal treatment (within the range of 1150°–1400° C.) both recovers part of the crystalline damage resulting from the ion implantation and evaporates the non-segregated material, to finally render the thickness of the buried dielectric uniform.

Although other processes in two or more sages have been proposed, these lead to the formation of structures which do not totally satisfy the requirements detailed in the present invention, in that they are obtained either with high energy and high fluence (for example U.S. Pat. No. 4,975,126 Dec. 4, 1990, J. Margail et al.) or with low energy and low fluence (for example F. Namavar et al., 1990 IEEE SOS/SOI Tech. Conf. Proc. Key West Fla., page 49). In accordance with the aforedescribed process of the present invention, a structure is obtained, as stated, which differs from an analogous structure consisting of thin dielectrics obtained in proximity to the silicon surface by low-energy implantation and made deep by an epitaxial growth, in that in this case he single-crystal layer grown by epitaxy is characterised by a lower dissolved oxygen content than the original silicon layer and a greater structural defectiveness.

The SOI structure obtained by the process of the present invention is characterised by a surface layer of single-crystal silicon of thickness between 100 nm and 400 nm and a buried layer of silicon dioxide of thickness between 80 nm and 150 nm.

EXAMPLE

The example to be described relates to an SOI structure with a thin-layer buried insulator as applicational example (FIG. 1), it being understood however that this applicational example can be extended and that the choice of parameters is not binding. In this case, the target consists of single-crystal silicon orientated in accordance with the planes (100), positioned in front of the ion beam at an angle of 15° to the normal to the plane of the crystal, and with a rotation of 20° about the horizontal of the main flat side.

The ion beam consists of positive oxygen ions of atomic weight 16. This beam is accelerated to 100 kV in the first implantation stage and to 140 kV in the second stage.

Figure 2A:
FIG. 2a shows an SOI structure after an oxygen fluence of about $5\times10^{15}$ $O/cm^2$ has been implanted during the first stage of the invention, without external heating of the target.

The first stage terminates when an oxygen fluence of about $5 \times 10^{15}$ O/cm$^2$ has been implanted, without external heating of the target (FIG. 2a).

Figure 2B:
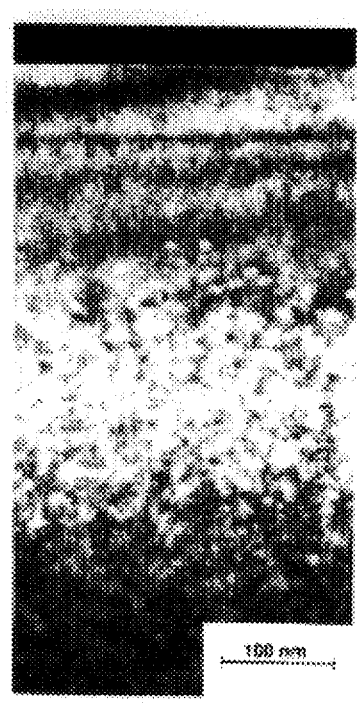
FIG. 2b shows the SOI structure after thermal treatment at 650° C. for about 10 hours in an inert environment.

The first implantation stage is followed by a first thermal treatment to produce growth of the silicon dioxide nuclei formed as a result of separation of supersaturated oxygen from the silicon matrix. This thermal treatment is conducted typically at 650° C. for about 10 hours in an inert environment (nitrogen or argon) (FIG. 2b).

The second ion implantation stage is characterised by heating the target to about 600° C. and oxygen ion implantation at a fluence of about $5 \times 10^{17}$ O/cm$^2$.

This second implantation stage is followed by a second thermal treatment at high temperature. To prevent damage to the sample surface and to protect it from any contamination originating from the external environment, the sample is covered with a silicon dioxide layer of about 600 nm thickness deposited by low pressure chemical vapour deposition (LPCVD). The second thermal treatment is conducted at about 1300° C. for about 8 hours in an inert environment (argon).

Figure 3A:
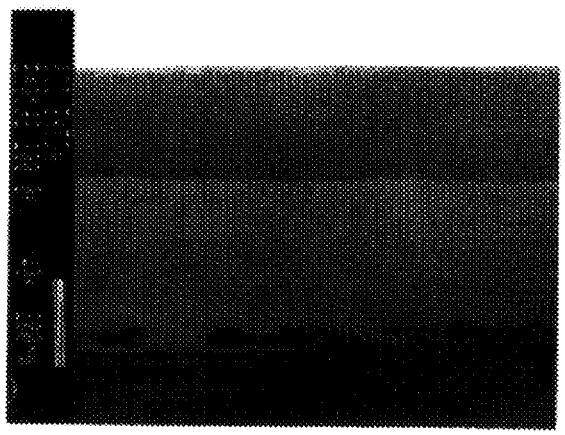
FIG. 3a shows the structure of a currently commercially available SOI structure.
Figure 3B:
FIG. 3b shows an SOI structure of the invention after both the initial and final stages of ion implantation and thermal treatment have been completed.

The result of this process is the structure shown in FIG. 3, in which the thicknesses of the single-crystal surface layer and of the buried silicon dioxide layer are about 280 nm and 100 nm respectively.

These thicknesses are compared in FIG. 3 with the typical thicknesses of the structure currently available commercially (250 nm of silicon and 400 nm of buried dioxide, FIG. 3a).

We claim:

1. A process for preparing an SOI structure with a deep thin oxide layer, having a thickness between 80 nm and 150 nm, comprising the following stages in succession:

a first ion implantation at an oxygen fluence within the range of $10^{15}-10^{16}$ ions/cm$^2$;

thermal treatment at a temperature within the range of 600°–900° C.;

a second ion implantation at an oxygen fluence within the range of $2 \times 10^{17}-8 \times 10^{17}$ ions/cm$^2$;

final thermal treatment at a temperature within the range of 1150°–1400° C.

* * * * *